United States Patent [19]
Lindsay et al.

[11] Patent Number: 5,522,038
[45] Date of Patent: May 28, 1996

[54] TESTING MAPPED SIGNAL SOURCES

[75] Inventors: R. Brent Lindsay; Kevin G. Duesman, both of Boise, Id.

[73] Assignee: Micron Technology, Inc., Boise, Id.

[21] Appl. No.: 434,703

[22] Filed: May 4, 1995

Related U.S. Application Data

[63] Continuation of Ser. No. 49,043, Apr. 16, 1993, abandoned.
[51] Int. Cl.$^6$ .................................................. G06F 11/00
[52] U.S. Cl. ........................... 395/183.17; 395/183.18; 395/183.05
[58] Field of Search ..................... 395/183.18, 183.16, 395/183.05, 183.01, 183.08, 183.17; 371/21.1, 21.2, 21.3, 21.4, 21.5, 21.6

[56] References Cited

U.S. PATENT DOCUMENTS

| | | | |
|---|---|---|---|
| 4,481,627 | 11/1984 | Beauchesne et al. | 371/21.1 |
| 4,606,025 | 8/1986 | Peters et al. | 371/21.1 |
| 4,622,668 | 11/1986 | Dancker et al. | 371/21.1 |
| 4,794,599 | 12/1988 | Purcell et al. | 371/20.1 |
| 4,827,476 | 5/1989 | Garcia | 371/21.1 |
| 4,980,888 | 12/1990 | Bruce et al. | 371/21.1 |
| 5,025,205 | 6/1991 | Mudill et al. | 371/22.1 |
| 5,117,393 | 5/1992 | Miyazawa et al. | 371/21.1 |
| 5,119,338 | 6/1992 | Saito | 371/21.1 |
| 5,157,664 | 10/1992 | Waite | 371/21.1 |
| 5,200,959 | 4/1993 | Gross et al. | 371/21.6 |
| 5,263,029 | 11/1993 | Wicklund, Jr. | 371/21.1 |

*Primary Examiner*—Robert W. Beausoliel, Jr.
*Assistant Examiner*—Joseph E. Palys
*Attorney, Agent, or Firm*—Kirkpatrick & Lockhart

[57] ABSTRACT

A system for validating mapped signal generation permits identifying deficiencies in dynamic random access memory testing. As an example application of mapped signals consider memory testing. Memory tests such as stripe and checkerboard pattern tests frequently involve topological maps in order to permit use of the same memory test system and test program on memory devices and systems having different characteristics. An effective memory test exercises a memory cell by storing data therein which is of opposite physical polarity to data stored in physically adjacent cells. Topological maps account for variation in polarity of stored data depending on the address of a cell and variation due to the physical layout of cells which may not necessarily place consecutively addressed cells in physical proximity. A fixture for dynamic random access memory testing according to the present invention includes a battery, a signal multiplexer, and mode switching circuitry. Test methods using such a fixture allow correlation of the performance of a second tester to the performance of a first tester. According to a test method of the present invention, a first tester writes a test pattern into a memory device mounted on a fixture, the memory device is moved to the second tester, and an evaluation is made based on a pattern read-back operation conducted on the second tester. The read-back pattern is compared to the pattern preserved in the memory device by operation of circuitry in a test fixture of the present invention.

10 Claims, 5 Drawing Sheets

TESTING MAPPED SIGNAL SOURCES

This application is a continuation of application Ser. No. 08/049,043 filed Apr. 16, 1993, now abandoned.

FIELD OF THE INVENTION

This invention relates to digital signal validation. Particularly it relates to validating digital signals used for testing memory devices and testing systems responsive to mapped digital signals.

BACKGROUND OF THE INVENTION

Mapped digital signals are frequently employed in the testing of memory devices. To better understand how digital signals are mapped and the purpose of mapping, it is convenient to begin with a review of an application of mapped digital signals, specifically, the testing of memory devices.

Reliable data storage and retrieval is a valuable characteristic of electronic devices and systems. Where the device or system has the capability to store a multiplicity of independent data bits, rigorous tests are often employed during manufacturing to ensure independent storage and retrieval. It is common in a defective storage device or system that a write operation to a first addressed location erroneously affects data in a second location that is expected to be independent of the first. Similarly, a read operation that is expected to retrieve data written to a first location may be unsuccessful. An unsuccessful read operation may have retrieved data from an unexpected location or the data may have been affected by other data physically located close to the storage location being read.

In systems capable of storing a large quantity of data, exhaustive tests of every possible read failure mechanism are impractical. However, a wide majority of defects can be identified by so called pattern tests. The most popular memory pattern tests include stripe and checkerboard patterns. These patterns are developed to exercise a cell by storing data in the tested cell that is of an opposite logic state from the data stored in cells physically surrounding the tested cell or related control circuits. The test pattern designer develops a test pattern with knowledge of the physical arrangement of cells in the device or system, knowledge of the row and column addresses identifying each cell, and knowledge of the electrical conditions corresponding to logical data values stored. Taken together, this knowledge is called the topology of the memory device or system.

Once a pattern test has been written, it is desirable to use that pattern test on a variety of devices and systems as well as a variety of test equipment. Translation is required because not all devices and systems to be tested have the same topology. A memory device having an addressable array of rows and columns of cells is said to have a topology that relates the physical location of the cell to the logical number of the row and column used to address that cell. Some devices are physically arranged with odd numbered rows physically adjacent to each other and even numbered rows physically adjacent to each other forming two separate sections of the device. Other devices interleave the rows by a multiple, for example by 1 for consecutive rows or by 4 for groups of rows. Similarly, columns could be interleaved in any manner. The data representation in a cell may be a logic high in one section of the array and a logic low in an adjacent cell for the same logic state being stored. These three variations of topology are collectively called topological maps.

A standard pattern test can be translated using topological maps so that the pattern test relates properly to a particular device under test. If the topological mapping is incorrect, the effectiveness of the test may be compromised. For example, if a topological map that specified that consecutively addressed rows were physically adjacent was used to test a device having odd numbered rows located in a first section of the device and even numbered rows located in a second section of the device physically removed from the first, then a stripe test designed to write and read back opposite data in consecutive rows would not properly stress the memory device. In addition to memory device characteristics, topological translation may also be dependant on the make and model of the tester being used to execute the pattern test.

Existing methods for verifying topological translation definitions (signal mapping) are unsatisfactory. As an example, consider a dynamic random access memory manufacturing facility that uses two different models of dynamic random access memory testers for the same product line. If the rate of detecting defective memory devices on the first tester is higher than the rate of detecting defective memory devices on the second tester, then there is reason to suspect that the second tester's test method is defective in some way. The second tester could be analyzed using a memory that was intentionally manufactured with a known defect. However, manufacture of such a memory could be costly when normal manufacturing is fully automated. As a second strategy, a test fixture that was designed to exhibit a defect could be built. However, the cost of manufacturing a test fixture is high and the choice of defects that can be designed into the test fixture is limited. As a third strategy, a fully functional memory could be intentionally damaged to cause an intended defect. Again, the choice of possible defects is limited. Finally, a strategy wherein the pattern test software is modified to fail to refresh a location or range of locations in the dynamic memory could be accomplished. However, in this case, it may be difficult to distinguish a defective or invalid row or column using the tester display because the tester display may lack convenient access to sufficient display resolution.

Without an effective strategy for diagnosing a defective test method, the operator or maintenance personnel may waste time debugging the tester. If the condition is allowed to persist, the tester operator may loose confidence in test results. Poor quality memory devices may be shipped. When test results are unreliable, incorrect yield analysis may lead to incorrect design decisions. Any or all of these effects may eventually erode product profitability.

In the memory testing example above, memory address input signals and memory data input signals are generated by the memory tester according to a logical to physical mapping algorithm. The mapping algorithm may use a table of values or algebraic expressions to express the required translation. If a value in a table is incorrect, a boundary condition of the algebraic expression is incorrect, or a defect exists in the tester electronics that provide the translation function, the memory test will not be fully effective.

There remains a need for a test fixture and test method that can quickly diagnose defects in memory devices and systems, in topologically mapped memory testers, and in topological maps used in memory testing.

A similar problem exists generally for operation and testing of systems which respond to mapped digital signals. In general, a digital signal is mapped to produce a translated or mapped signal when some degree of flexibility or compatibility is required. For example, mapped signals are used to accommodate changing the appearance of graphic information displayed by a computer system and mapped signals are used to accommodate changing peripheral devices in a computer controlled process control system. In each of these cases, there remains a need for a test fixture and test method that can quickly diagnose defects in a source of mapped signals.

SUMMARY OF THE INVENTION

Accordingly, a system of the present invention is designed to record mapped signals for further analysis. In one embodiment, the contents of a dynamic memory device connected to the system are preserved during a time when the system is disconnected from external power. Such a system typically includes a circuit for preserving data in the memory device and may be used effectively in memory testing strategies. A data preservation circuit of the present invention includes a source of power such as a battery for providing power to the memory device, a memory signal generator for generating control signals such as for refreshing dynamic memory or causing a controller circuit to preserve the content of volatile memory, and means for selectively enabling data preservation when required.

Generally, a system of the present invention has at least two modes of operation: a passive mode and an active mode. In the active mode, the system is responsible for retaining memory contents. In the passive mode, the system relies on an external source of power and memory control signals to operate the memory.

According to a first aspect of the present invention, a memory device is controlled by the output of a multiplexer so that all read and write operations of the memory device are feasible in passive mode and at least a data retention operation is feasible in active mode.

According to another aspect of the present invention, transitions between active and passive modes are synchronized with an external signal to avoid loss of memory contents.

According to another aspect of the present invention, an oscillator is coupled to the multiplexer for use in active mode to eliminate the need for external equipment and to allow long term storage of the system without loss of memory contents.

According to another aspect of the present invention, an interface signal is monitored so that transitions between passive and active modes of operation require no manual intervention.

The present invention is practiced according to a first method for validating mapped signals generated by a source of mapped signals. The method comprises the steps of coupling a memory device or system to the source; recording in the memory a plurality of values of the mapped signals; preserving and maintaining the recorded values against the possibility of erasure or decay of the recorded values; optionally, removing the memory from the source; and coupling the memory to an analyzer of the recorded values. In some cases the source equipment will have analysis capability so the memory can be removed from the source and recoupled to the source at a later time. In another case, where two sources having analytical capability exist, mapped signals are recorded from the first source and analyzed on the second source.

In another embodiment of the method described above, a step is added for detecting loss of power supplied from the source of mapped signals.

In yet another embodiment of the method described above, a step is added for providing battery power and volatile memory preservation signals while loss of power from the source of mapped signals exists.

The system and methods described above are beneficially applicable to both volatile and nonvolatile memory testing. For nonvolatile memory testing, the difficulties of detecting topological mapping defects in the test systems, memory device, or test methods are overcome.

These and other aspects, advantages, and results provided by the present invention will become apparent by reference to the following description of the invention in conjunction with the referenced drawing figures. For simplicity and brevity, the invention is described in terms of validating the mapped signals sourced by a dynamic memory tester.

Signals that appear on several of the Figures and have the same mnemonic are directly or indirectly coupled together. A signal named with a mnemonic and a second signal named with the same mnemonic followed by an asterisk are related by logic inversion.

DETAILED DESCRIPTION OF THE INVENTION

Figure 1:
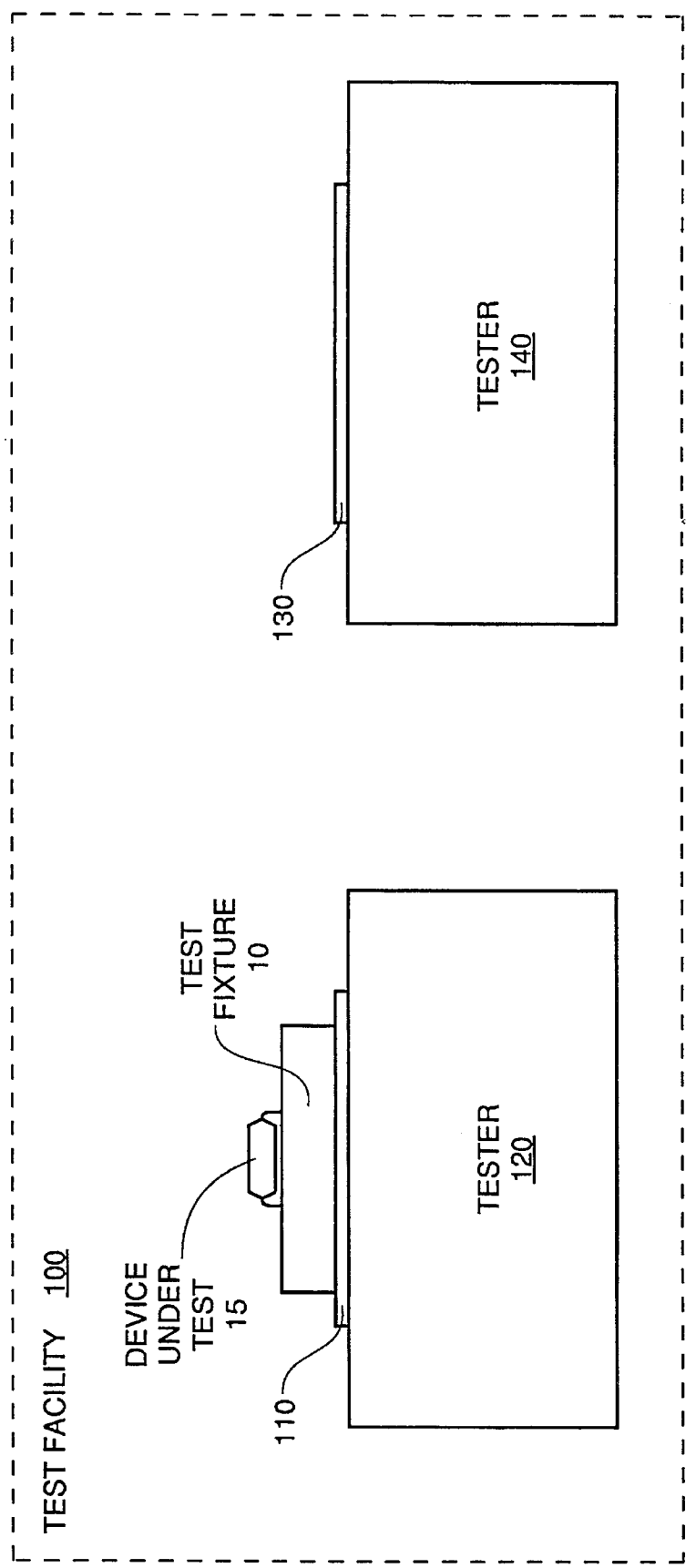
FIG. 1 is a plan view of a test area showing two testers and a test fixture of the present invention.

FIG. 1 is a plan view of test area 100 employing two esters 120 and 140 and test fixture 10 of the present invention. Test fixture 10 is mounted on test fixture socket 110 of tester 120. A memory device under test 15 is mounted on test fixture 10.

When performing a pattern test, tester 120 writes data through test fixture 10 to be stored by device under test 15. Next, tester 120 performs a read-back operation of the memory in device under test 15 through test fixture 10. Test results thus obtained will be used for correlation with similar results obtainable from tester 140.

To identify differences in the pattern testing methods of testers 120 and 140, test fixture 10 is removed from test fixture socket 110 and mounted on test fixture socket 130. If device under test 15 contains volatile memory, test fixture 10 provides power and refresh signals to device under test 15 while test fixture 10 is disconnected from tester 120 and tester 140. Finally, a pattern read-back operation is performed by tester 140 and the results are compared with the results earlier obtained from tester 120.

Figure 2:
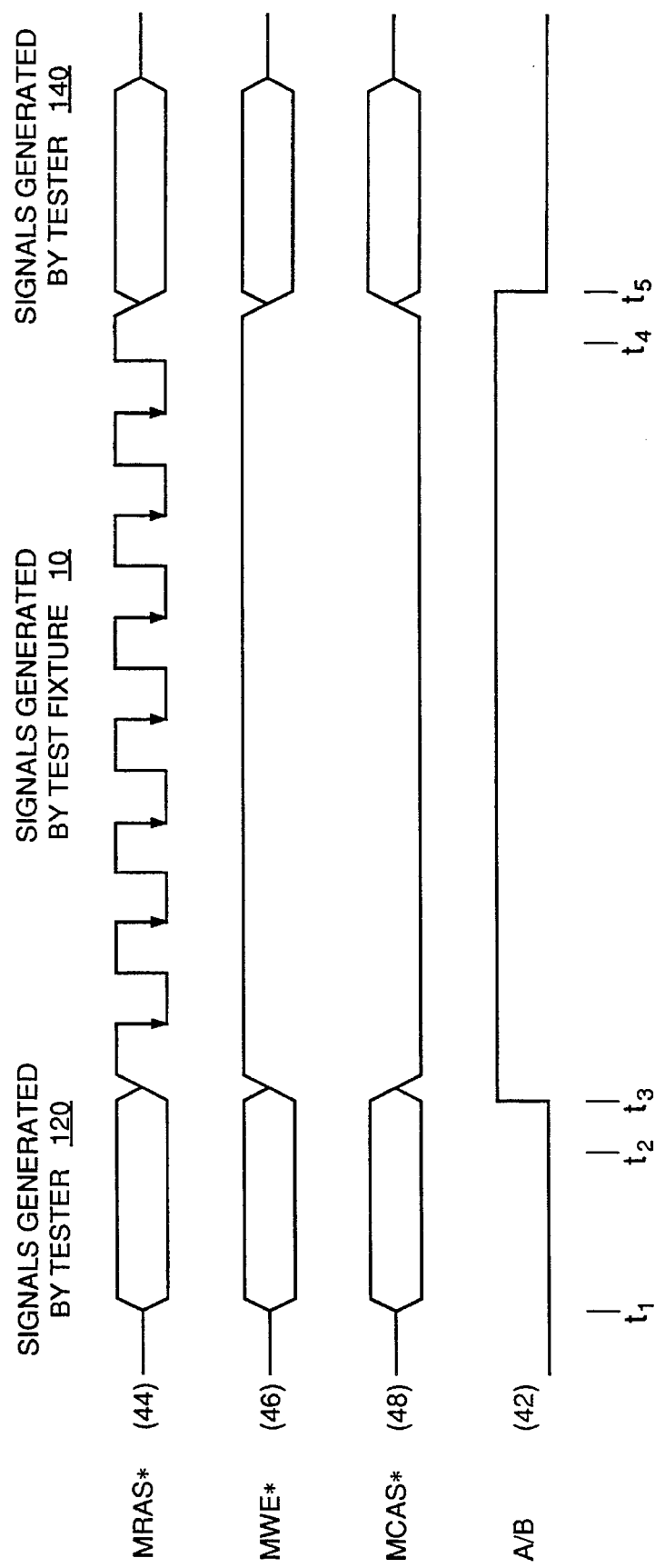
FIG. 2 is a timing diagram showing signals generated by a test fixture of the present invention. In the timing diagram the vertical axis represents binary logic levels and the horizontal axis represents time. Neither axis is drawn to scale. The vertical axis is intended to show the rendition from active (asserted) to passive (non-asserted) states of each logic signal. The voltage levels corresponding to the logic states of the various signals are not necessarily identical among the various signals.

FIG. 2 is a timing diagram of signals generated by test fixture 10 designed for use with conventional dynamic memory devices. The timing diagram is divided into 3 sections. From time T1 to time T3, signals MRAS, MWE*, and MCAS* are generated by tester 120. Signal A/B is a control signal to be discussed below. From time T3 to time T5, signals MRAS*, MWE*, and MCAS* are generated by test fixture 10. From time T5 and on, signals MRAS*, MWE*, and MCAS* are generated by tester 140.

From time T3 to time T5 signal A/B is active high, indicating signals are being generated by test fixture 10. The three signals MRAS*, MWE*, and MCAS* correspond, respectively, to the row address strobe, write enable, and column address strobe as used on conventional dynamic random access memory (DRAM) devices. Between times T3 and T5 high to low transitions on MRAS* while MCAS* is low accomplish a CAS-before-RAS refresh cycle. In the conventional DRAM, the CAS/before/RAS refresh cycle increments an internal counter which generates row addresses to be refreshed. According to the DRAM specifications, it is typically necessary to generate a large number (for example, 512) of RAS* transitions within, for example, 8 milliseconds in order to prevent loss of the pattern stored in memory device under test 15.

FIG. 2 illustrates two modes of operation for test fixture 10: an active mode and a passive mode. In the passive mode, all signals communicated between the tester and the test fixture are coupled to the device under test. In the active mode, signals generated by test fixture 10 are coupled to device under test 15. A switch from passive to active modes occurs at time T2 with response at time T3 and from active to passive modes at time T4 with response at time T5. Circuitry to accomplish the selective coupling of signals and the mode switching is best understood from the schematic diagrams.

Figure 3:
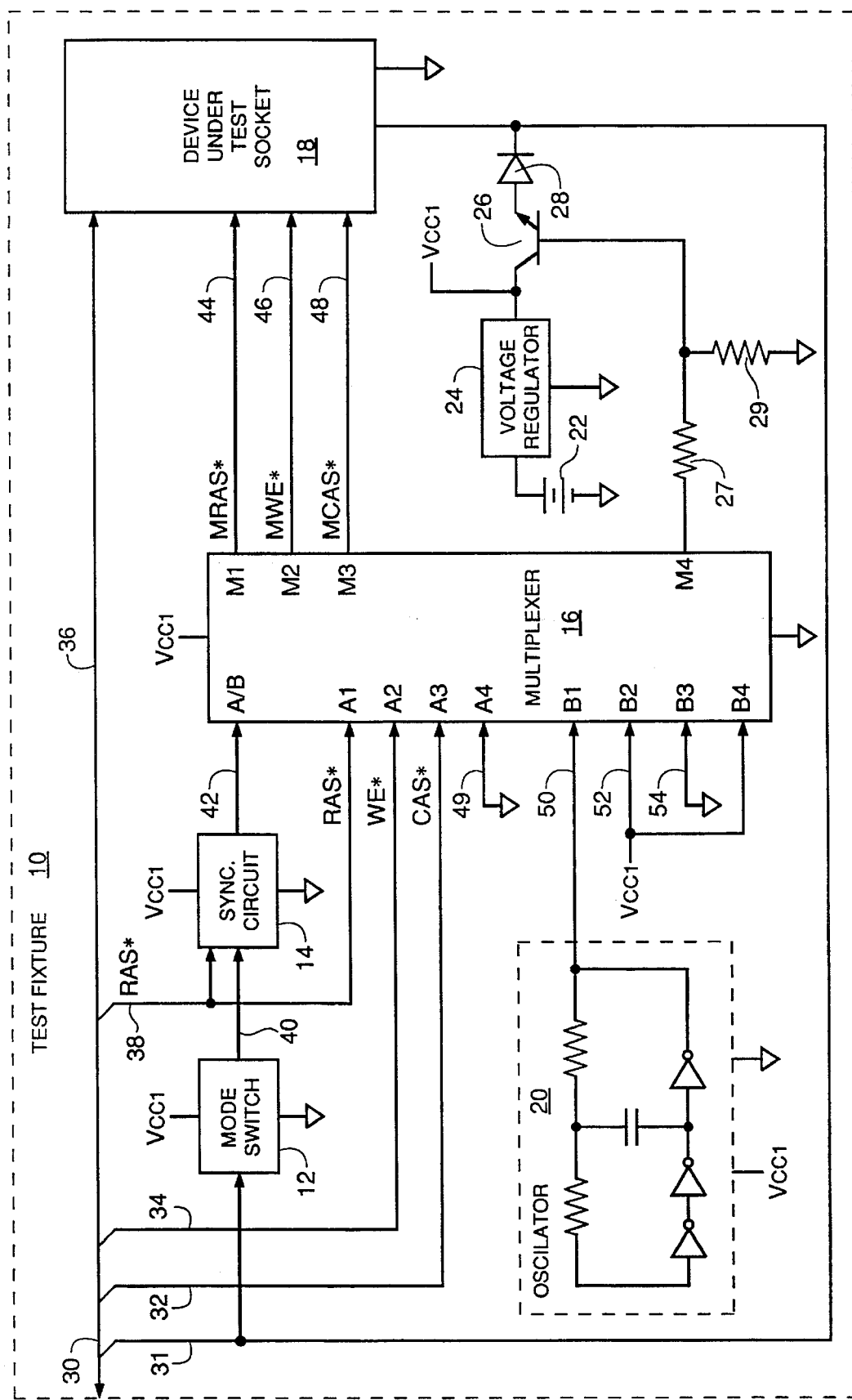
FIG. 3 is a functional block diagram of a test fixture of the present invention. A single line between functional blocks may represent one or more signals.

FIG. 3 is a schematic diagram of test fixture 10. When test fixture 10 is mounted on tester 120 or tester 140, signals 30 are coupled to the tester. Signals 30 would ordinarily include power, clock, and data signals. Power signal 31 connects from the test fixture interface to device under test socket 18. Column address strobe (CAS*) signal 32 and write enable (WE*) signal 34 connect to multiplexer 16. Row address strobe (RAS*) signal 38 is connected to synchronization circuit 14 and multiplexer 16. Remaining signals 36 connect from the test fixture interface to device under test socket 18. Mode switch 12 provides mode signal 40 to indicate active or passive mode for test fixture operation. Mode signal 40 is synchronized with RAS* signal 38 in synchronization circuit 14 to provide A/B signal 42 to multiplexer 16. In the passive mode of operation, signals connected to multiplexer 16 inputs A1 through A4 are coupled to multiplexer 16 outputs M1 through M4. Therefore, MRAS* signal 44, MWE* signal 46, and MCAS* signal 48 from multiplexer outputs M1, M2 and M3 respectively connect to device under test socket 18. In the passive mode of operation these signals correspond to signals 44 through 48 shown in FIG. 2 from time T1 to time T3.

Oscillator 20 connects to multiplexer 16 input B1. The remaining inputs B2 through B4 on multiplexer 16 connect to power and ground signals to establish stable logic levels. When mode switch 12 indicates active mode of operation, mode signal 40 is synchronized with RAS* signal 38 to provide A/B signal 42 to multiplexer 16.

In active mode, signals input to multiplexer 16 on inputs B1 through B4 are coupled to multiplexer 16 outputs M1 through M4. Thus, oscillator 20 provides high to low transitions on MRAS* signal 44. Signal MWE* is held high and signal MCAS* is held low defining a CAS-before-RAS refresh cycle.

Battery 22 provides power to voltage regulator 24 which defines voltage level VCC1 used to power mode switch 12, synchronization circuit 14, oscillator 20, and multiplexer 16. In passive mode, series pass transistor 26 is off and power signal 31 from tester 120 is supplied to device under test socket 18. Blocking diode 28 prevents power signal 31 from being loaded by voltage regulator 24 and series pass transistor 26. Blocking diode 28 also permits voltages on power signal 31 to exceed the base-emitter breakdown voltage of series pass transistor 26. In active mode a high logic level is coupled to multiplexer 16 output M4. The high logic level, when divided by resistors 27 and 29, provides a bias current to the base of series pass transistor 26. When series pass transistor 26 is on, voltage regulator 24 supplies power through series pass transistor 26 and blocking diode 28 to device under test socket 18.

In an alternate embodiment, not shown, mode signal 40 is coupled to oscillator 20 to prevent oscillation when in passive mode. Means to accomplish a gated oscillator circuit are well known to those skilled in the art.

Several modifications to the power circuitry are apparent to those skilled in the art. For example, all circuits in the fixture may be supplied exclusively from battery power if supply voltage testing of the device under test is not required. As another example, a switch could be added to disconnect battery power when there is no need to preserve memory contents.

Figure 4:
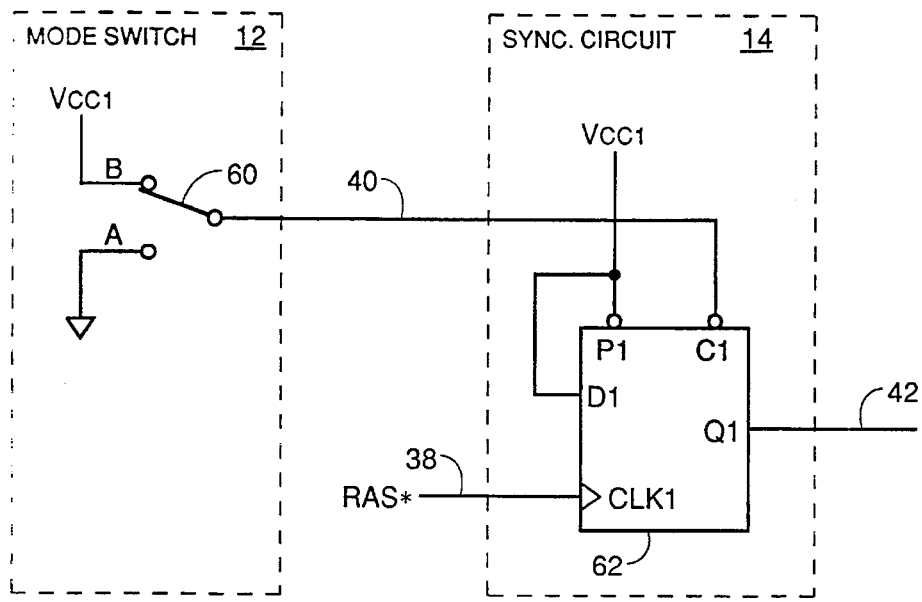
FIG. 4 is a schematic diagram of the mode switch and synchronization circuit.

FIG. 4 is a schematic diagram of mode switch 12 and synchronization circuit 14. Mode switch 12 in this embodiment is manual switch 60 providing a high logic level in position B and a low logic level in position A. Position A corresponds to passive mode. When manual switch 60 is in position A, a ground level is applied to the clear input of flip-flop 62 within synchronization circuit 14. Flip-flop 62 output Q1 provides A/B signal 42 at a low level consistent with timing diagram FIG. 2 at time T1 through time T3 and time T5 and on. At time T2 as shown in FIG. 2, manual switch 60 is moved to position B. The Q output of flip-flop 62 is set as a consequence of the high logic signal on flip-flop 62 D1 input and a low to high transition on RAS* signal 38. Because flip-flop 62 clear input (C1) is pulled high internally, switch bounce on manual switch 60 in contact position B will not result in spurious signals on A/B signal 42.

Figure 5:
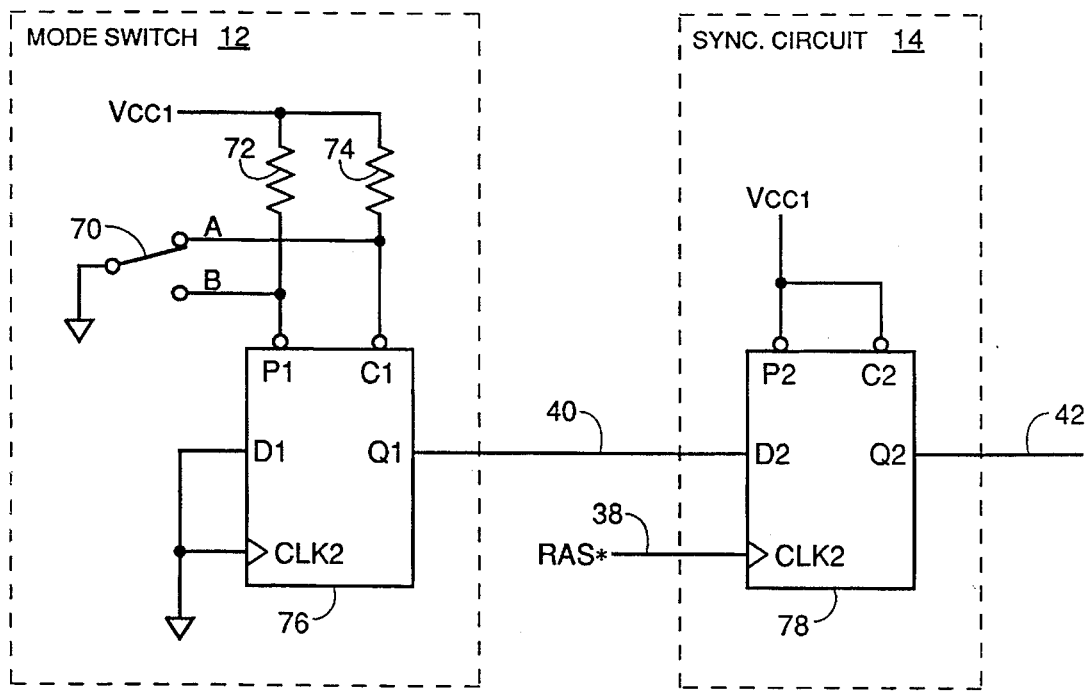
FIG. 5 is a schematic diagram of an alternate mode switch and synchronization circuit.

FIG. 5 is a schematic diagram of an alternate embodiment of mode switch 12 and synchronization circuit 14. In this embodiment, mode switch 12 includes manual switch 70 and flip-flop 76. Switch bounce in position A or position B will not result in spurious signals on mode signal 40 due to the operation of flip-flop 76. A transition on manual switch 70 from position from A to B or from position B to A will result in only one transition on mode switch output 40. Output Q2 of flip-flop 78 makes one transition on the next occurring low to high transition of RAS* signal 38. In this embodiment, switch bounce caused by manual switch 70 does not appear on A/B signal 42.

Figure 6:
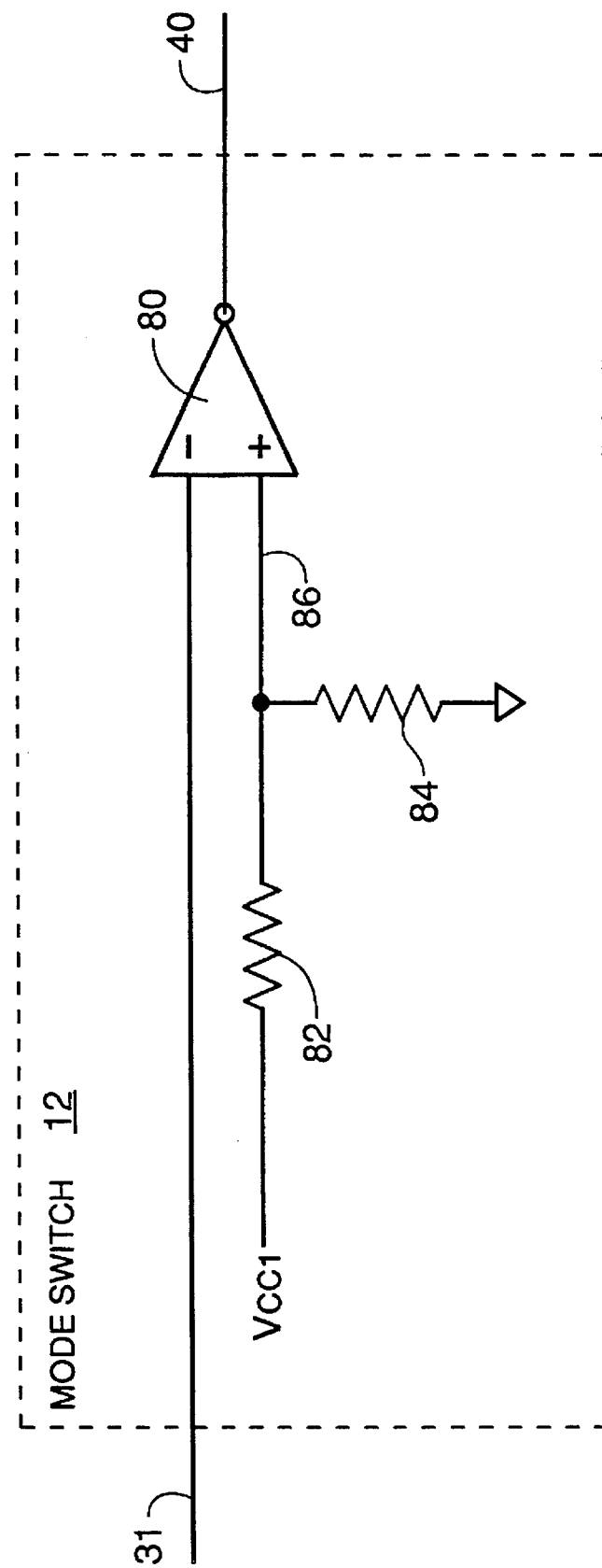
FIG. 6 is a schematic diagram of an alternate mode switch.

FIG. 6 is a schematic diagram of an alternate embodiment of mode switch 12. In this embodiment power signal 31 from the test fixture interface is compared to signal VCC1 derived from voltage regulator 24 by the comparison which produces mode signal 40. In operation, when the voltage on power signal 31 falls below the voltage on line 86 defined by voltage divider resistors 82 and 84, a transition is automatically made from passive to active mode.

Throughout the specification and the claims the following terminology is intended to be broadly construed. "A system" refers generally to electrical apparatus and includes but is not limited to a packaged integrated circuit, an unpackaged integrated circuit, a combination of packaged or unpackaged integrated circuits or both, a microprocessor, a microcontroller, a memory, a register, a flip-flop, a charge-coupled device, combinations thereof, and equivalents. Portions of the circuitry described above as part of the fixture may be incorporated within the device or system under test. A "signal" refers to mechanical and/or electromagnetic energy conveying information. When elements are coupled, a signal can be conveyed in any manner feasible in light of the nature of the coupling. For example, if several electrical conductors couple two elements, then a signal comprises the energy on one, some, or all conductors at a given time or time period. When a physical property of a signal has a quantitative measure and the property is used by design to control or communicate information, then the signal is said to be characterized by having a "value."

While for the sake of clarity and ease of description, several specific embodiments of the invention have been described; the scope of the invention is intended to be measured by the claims as set forth below. Other embodiments of the invention will be apparent in light of the disclosure to one of ordinary skill in the arts to which the invention applies.

What is claimed is:

1. A method for validating mapped signal generation, comprising the steps of:

coupling a first tester to a test fixture carrying a memory device;

inputting mapped signals generated by the first tester through said test fixture to said memory device for storage therein;

reading said mapped signals stored in said memory device with said first tester;

uncoupling said test fixture from said first tester;

coupling a second tester to said test fixture;

reading said mapped signals stored in said memory device with said second tester; and comparing the mapped signals read by said first tester to the map signals read by said second tester.

2. The method of claim 1 further comprising the steps of:

detecting the uncoupling of said test fixture from said first tester; and maintaining the state of the memory device in response to the detection of the uncoupling.

3. The method of claim 2 wherein the memory device comprises a dynamic memory device, and wherein the step of maintaining the memory includes providing a refresh signal to the memory device.

4. The method of claim 1 wherein said first tester maintains a standard pattern test and a plurality of topological maps, and wherein said first tester generates the mapped signals by selecting one of said topological maps and translating the standard pattern test using said selected topological map.

5. The method of claim 4 wherein said step of comparing the mapped signals read by said first tester to the mapped signals read by said second tester provides an indication of whether said first tester has properly translated the pattern test.

6. The method of claim 4 wherein said step of comparing the mapped signals read by said first tester to the mapped signals read by said second tester provides an indicating of whether said first tester has selected the proper topological map.

7. The method of claim 4 wherein said step of comparing the mapped signals read by said first tester to the mapped signals read by said second tester provides an indication of errors in the selected topological map.

8. The method of claim 4 including the step of determining a pin assignment, and wherein said step of selecting one of said topological maps is responsive to a determined pin assignment.

9. The method of claim 1 wherein said step of inputting mapped signals generated by the first tester includes the step of generating mapped signals comprising an address value and a data value.

10. The method of claim 9 wherein said step of generating mapped signals comprising an address value and a data value includes the step of generating mapped signals wherein the address value is concurrent with the data value.

\* \* \* \* \*